(12) United States Patent
Sun

(10) Patent No.: US 11,380,867 B2
(45) Date of Patent: Jul. 5, 2022

(54) DISPLAY PANEL AND DISPLAY DEVICE

(71) Applicant: Wuhan China Star Optoelectronics Semiconductor Display Technology Co., LTD., Hubei (CN)

(72) Inventor: Jiajia Sun, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 144 days.

(21) Appl. No.: 16/622,354

(22) PCT Filed: Nov. 7, 2019

(86) PCT No.: PCT/CN2019/116193
§ 371 (c)(1),
(2) Date: Dec. 13, 2019

(87) PCT Pub. No.: WO2021/027112
PCT Pub. Date: Feb. 18, 2021

(65) Prior Publication Data
US 2021/0280823 A1    Sep. 9, 2021

(30) Foreign Application Priority Data

Aug. 13, 2019  (CN) .......................... 201910742523.6

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3246* (2013.01); *H01L 51/56* (2013.01); *H01L 2227/323* (2013.01)

(58) Field of Classification Search
CPC . H01L 51/5253; H01L 51/56; H01L 27/3246; H01L 2227/323
See application file for complete search history.

(56) References Cited

U.S. PATENT DOCUMENTS

2016/0284774 A1\* 9/2016 Zhang ................. H01L 27/3246
2018/0061910 A1    3/2018 Cai
(Continued)

FOREIGN PATENT DOCUMENTS

CN    107068715 A      8/2017
CN    108258146 A  *   7/2018  ......... H01L 51/5256
(Continued)

*Primary Examiner* — Vongsavanh Sengdara
(74) *Attorney, Agent, or Firm* — Benesch, Friedlander, Coplan & Aronoff LLP

(57) ABSTRACT

The present application provides a display panel and a display device. The display panel includes a display area, a hole-digging area, and a buffer area between the display area and the hole-digging area, wherein one or more retaining walls on the pixel defining layer in the buffer area, a top surface of the retaining wall is provided with a groove or a protrusion; the encapsulating layer is disposed on the light-emitting functional layer and the retaining wall, such that a contact area between a top surface of the retaining wall and the encapsulation layer is increased, thus avoiding the problem of film peeling between the retaining wall and the encapsulating layer.

10 Claims, 8 Drawing Sheets

(56) References Cited

U.S. PATENT DOCUMENTS

| | | | |
|---|---|---|---|
| 2019/0058020 A1* | 2/2019 | Tsai | .................... H01L 27/3246 |
| 2020/0044180 A1* | 2/2020 | Dai | ..................... H01L 51/0003 |
| 2020/0106045 A1* | 4/2020 | Han | .................... H01L 27/3258 |
| 2020/0176709 A1* | 6/2020 | Moon | ................... G06F 3/0412 |
| 2020/0312919 A1 | 10/2020 | Zhang et al. | |
| 2021/0184172 A1 | 6/2021 | Wang et al. | |

FOREIGN PATENT DOCUMENTS

| | | |
|---|---|---|
| CN | 108258146 A | 7/2018 |
| CN | 109494242 A | 3/2019 |
| CN | 109830521 A | 5/2019 |

* cited by examiner

DISPLAY PANEL AND DISPLAY DEVICE

BACKGROUND OF INVENTION

Field of Invention

The present application relates to a field of display technologies, and in particular, to a display panel and a display device.

Description of Prior Art

There is a new O-cut organic light-emitting diode (OLED) display panel, which is characterized in that an O-shaped via hole is designed in the non-edge display area, and a camera, an infrared sensor, an earpiece, and the like can be placed under the O-shaped via hole. Since the position of the O-shaped via hole can be arbitrarily set, the position flexibility of the module such as the under-screen camera, the infrared sensor, and the earpiece in the panel display area can be realized. Currently, in order to ensure the flexibility of the OLED panel, it is usually packaged and protected by thin film encapsulation (TFE) technology. TFE usually includes an inorganic-organic-inorganic laminated structure. The inorganic layer is usually deposited by chemical vapor deposition (CVD), physical vapor deposition (PVD), or atomic layer deposition (ALD). The organic layer is formed by inkjet printing (IJP). In order to prevent inkjet printing from overflowing the OLED boundary during leveling, one or more retaining walls are usually provided at the boundary, which are made of organic material. However, since the retaining wall is made of a material different from the first inorganic encapsulating layer, it is found that the film peeling is likely to occur during the process, which leads to failure of the OLED device.

Therefore, the conventional display panel has a problem of film peeling.

SUMMARY OF INVENTION

The present application provides a display panel and a display device to alleviate the technical problem that film peeling occurs in the existing display panel.

To solve the above problem, the technical solution provided by the present application is as follows:

The present application provides a display panel including a display area, a hole-digging area, and a buffer area between the display area and the hole-digging area; the display panel including: a substrate; a driving circuit layer disposed on the substrate, and not disposed in the buffer area and the hole-digging area; a pixel defining layer disposed on the driving circuit layer; a light-emitting functional layer disposed on the pixel defining layer; a retaining wall disposed in the buffer area and on the pixel defining layer; and an encapsulation layer disposed on the light-emitting functional layer and the retaining wall, wherein a contact area between a top surface of the retaining wall and the encapsulation layer is larger than an orthographically projected area of the top surface of the retaining wall on the substrate.

In the display panel provided by an embodiment of the present application, the top surface of the retaining wall is formed with at least one of grooves and protrusions.

In the display panel provided by an embodiment of the present application, the grooves or protrusions are continuously disposed.

In the display panel provided by an embodiment of the present application, the grooves or protrusions are discontinuously disposed.

In the display panel provided by an embodiment of the present application, the grooves or the protrusions formed on the top surface of the retaining wall are arranged in a row.

In the display panel provided by an embodiment of the present application, the grooves or the protrusions formed on the top surface of the retaining wall are arranged in a plurality of rows.

In the display panel provided by an embodiment of the present application, the plurality of rows of the grooves or the protrusions formed on the top surface of the retaining wall have an intersection.

In the display panel provided by an embodiment of the present application, the grooves or the protrusions have sectional shapes including at least one of an inverted trapezoid, a square, and an arc.

In the display panel provided by an embodiment of the present application, a plurality of rows of the retaining walls are formed in the buffer area, and at least one of the plurality of rows of the retaining walls is formed with grooves at their top surfaces.

In the display panel provided by an embodiment of the present application, a plurality of rows of the retaining walls are formed in the buffer area, and at least one of the plurality of rows of the retaining walls is formed with protrusions at their top surfaces.

The present application further provides a display device, including a display panel, the display panel including a display area, a hole-digging area, and a buffer area between the display area and the hole-digging area; the display panel including: a substrate; a driving circuit layer disposed on the substrate, and not disposed in the buffer area and the hole-digging area; a pixel defining layer disposed on the driving circuit layer; a light-emitting functional layer disposed on the pixel defining layer; a retaining wall disposed in the buffer area and on the pixel defining layer; and an encapsulation layer disposed on the light-emitting functional layer and the retaining wall, wherein a contact area between a top surface of the retaining wall and the encapsulation layer is larger than an orthographically projected area of the top surface of the retaining wall on the substrate.

In the display device provided by an embodiment of the present application, the top surface of the retaining wall is formed with at least one of grooves and protrusions.

In the display device provided by an embodiment of the present application, the grooves or protrusions are continuously disposed.

In the display device provided by an embodiment of the present application, the grooves or protrusions are discontinuously disposed.

In the display device provided by an embodiment of the present application, the grooves or the protrusions formed on the top surface of the retaining wall are arranged in a row.

In the display device provided by an embodiment of the present application, the grooves or the protrusions formed on the top surface of the retaining wall are arranged in a plurality of rows.

In the display device provided by an embodiment of the present application, the plurality of rows of the grooves or the protrusions formed on the top surface of the retaining wall have an intersection.

In the display device provided by an embodiment of the present application, the grooves or the protrusions have sectional shapes including at least one of an inverted trapezoid, a square, and an arc.

In the display device provided by an embodiment of the present application, a plurality of rows of the retaining walls are formed in the buffer area, and at least one of the plurality of rows of the retaining walls is formed with grooves at their top surfaces.

In the display device provided by an embodiment of the present application, a plurality of rows of the retaining walls are formed in the buffer area, and at least one of the plurality of rows of the retaining walls is formed with protrusions at their top surfaces.

The beneficial effects of the application are: the application provides a display panel and a display device, and the display panel includes a display area, a hole-digging area, and a buffer area between the display area and the hole-digging area, wherein one or more retaining walls on the pixel defining layer in the buffer area, a top surface of the retaining wall is provided with at least one groove or protrusion; the encapsulating layer is disposed on the light-emitting functional layer and the retaining wall, a contact area between a top surface of the retaining wall and the encapsulation layer is larger than an orthographically projected area of the top surface of the retaining wall on the substrate. The present application provides a groove or a protrusion on the top surface of the retaining wall in the buffer area, such that the contact area between the top surface of the retaining wall and the encapsulating layer is increased, thus avoiding the problem of film peeling between the retaining wall and the encapsulating layer.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

The following description of the various embodiments is provided to illustrate the specific embodiments of the invention. The spatially relative directional terms mentioned in the present invention, such as "vertical", "horizontal", "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

This embodiment of the present application can alleviate the technical problem that film peeling occurs in the existing display panel.

Figure 1:
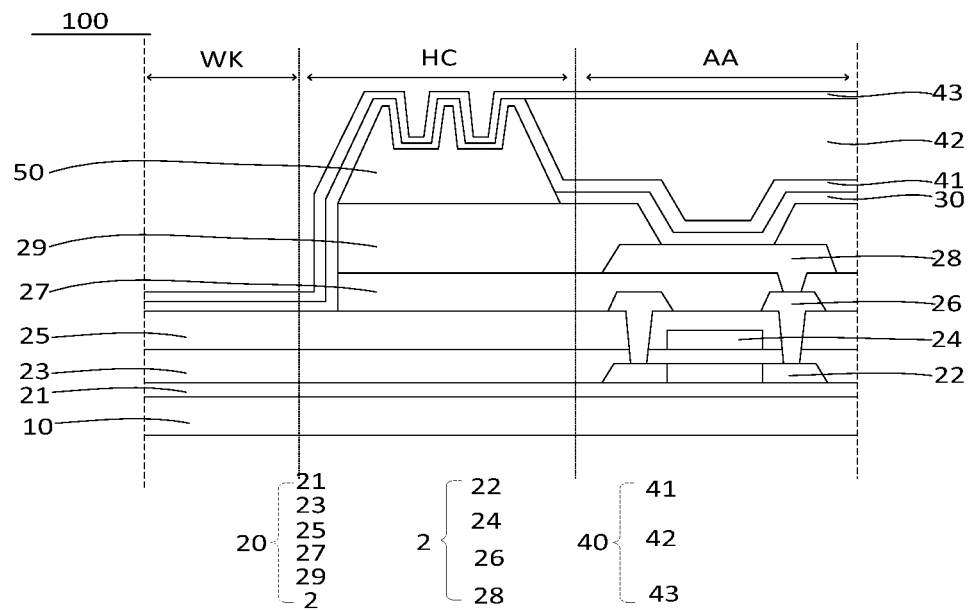
FIG. 1 is a schematic structural diagram of a display panel film layer according to an embodiment of the present application.

In one embodiment, as shown in FIG. 1, a display panel 100 is provided, including a display area AA, a hole-digging area WK, and a buffer area HC between the display area AA and the hole-digging area WK. The display panel 100 includes: a substrate 10; a driving circuit layer 20 disposed on the substrate 10, and not disposed in the buffer area HC and the hole-digging area WK; a pixel defining layer 29 disposed on the driving circuit layer 20; a light-emitting functional layer 30 disposed on the pixel defining layer 29; a retaining wall 50 disposed in the buffer area HC and on the pixel defining layer 29; and an encapsulation layer 40 disposed on the light-emitting functional layer 30 and the retaining wall 50, wherein a contact area between a top surface of the retaining wall 50 and the encapsulation layer 40 is larger than an orthographically projected area of the top surface of the retaining wall 50 on the substrate 10.

This embodiment provides a display panel, the display panel includes a display area, a hole-digging area, and a buffer area between the display area and the hole-digging area, wherein one or more retaining walls on the pixel defining layer in the buffer area, a top surface of the retaining wall is provided with at least one groove or protrusion; the encapsulating layer is disposed on the light-emitting functional layer and the retaining wall, a contact area between a top surface of the retaining wall and the encapsulation layer is larger than an orthographically projected area of the top surface of the retaining wall on the substrate. The present application avoids the problem of film peeling between the retaining wall and the encapsulating layer by increasing the contact area between the top surface of the retaining wall and the encapsulating layer.

In one embodiment, as shown in FIG. 1, a retaining wall 50 is formed on the pixel defining layer 29 in the buffer area HC, and a top surface of the retaining wall 50 is formed with a groove.

In one embodiment, as shown in FIG. 1, the driving circuit layer 20 is disposed on the substrate 10. The driving circuit layer 20 includes a buffer layer 21, an active layer 22, and a gate insulating layer 23, a gate layer 24, an interlayer insulating layer 25, a source/drain layer 26, a planarization layer 27, a pixel electrode layer 28, and a pixel defining layer 29; wherein the active layer 22, the gate layer 24, the source/drain layers 26, and the pixel electrode layer 28 constitute a driving circuit 2.

In one embodiment, the buffer layer 21, the gate insulating layer 23, the interlayer insulating layer 25, the planarization layer 27, and the pixel defining layer 29 of the driving circuit layer 20 extend from the display area AA to the buffer layer HC and the hole-digging area WK, wherein the drive circuit 2 does not extend to the buffer layer HC and the hole-digging area WK.

In one embodiment, a retaining wall 50 is formed on the pixel defining layer 29 of the buffer area HC by exposure and etching processes, and the retaining wall 50 is made of an organic material.

In one embodiment, a cross-sectional shape of the retaining wall 50 is trapezoidal, as shown in FIG. 1.

In an embodiment, the cross-sectional shape of the retaining wall may also be a square or other polygons.

In an embodiment, after the preparation of the retaining wall 50, the pixel defining layer 29 and the planarization layer 27 of the retaining wall 50 close to an inner side of the hole-digging area WK are removed by laser, exposure and etching, or the like. Because the defining layer 29 and the planarization layer 27 are made of organic material, their water and oxygen blocking ability is poor. Removing the pixel defining layer 29 and the planarization layer 27 therefrom can effectively cut off intrusion of the external water and oxygen into the light-emitting device, which is very sensitive to water and oxygen.

In one embodiment, a groove is formed on the top surface of the retaining wall 50 by nanoimprinting or laser etching. A number of the grooves may be one or more. In this embodiment, the number of grooves is preferably two, as shown in FIG. 1.

In one embodiment, a cross-sectional shape of the groove is an inverted trapezoid, as shown in FIG. 1.

Figure 2:
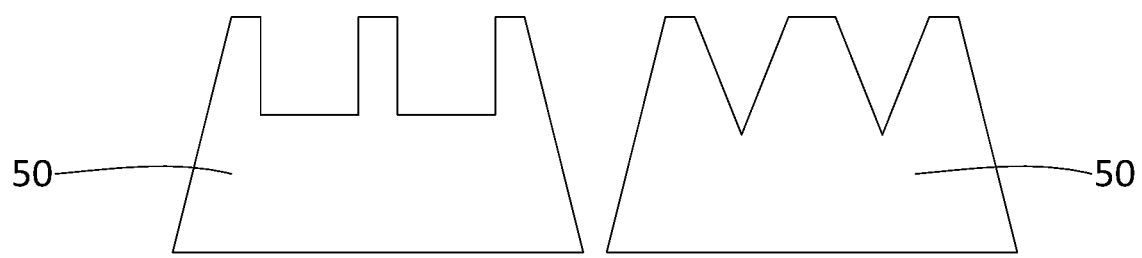
FIG. 2 is a schematic cross-sectional view of a groove of a top surface of a retaining wall according to an embodiment of the present application.

In one embodiment, a cross-sectional shape of the groove may be at least one of a square shape, an arc shape, or a triangle shape, as shown in FIG. 2.

In one embodiment, the light-emitting functional layer 30 is disposed on the pixel defining layer 29 of the driving circuit layer 20, and the light-emitting functional layer 30 includes stacked layers of a hole injection layer, a hole transport layer, a luminescent material layer, an electron transport layer, an electron injection layer, and a cathode layer (not shown).

In one embodiment, as shown in FIG. 1, the encapsulation layer 40 is disposed on the light-emitting functional layer 30 and the retaining wall 50, and the encapsulation layer 40 includes at least stacked layers of a first inorganic encapsulating layer 41, the first organic encapsulation layer 42, and the second inorganic encapsulation layer 43.

In one embodiment, any one of physical vapor deposition (PVD), chemical vapor deposition (CVD), and atomic layer deposition (ALD) is employed to deposit the first inorganic encapsulation layer 41 on the light-emitting functional layer 30 and the retaining wall, and the first inorganic encapsulation layer 41 is filled in the groove of the top surface of the retaining wall 50, such that the contact area between a top surface of the retaining wall 50 and the encapsulation layer 41 is increased, effectively avoiding the problem of film peeling between the retaining wall 50 and the first inorganic encapsulating layer 41. Since the retaining wall is made of an organic material, film peeling between the retaining wall 50 and the first inorganic encapsulating layer 41 is easy to occur.

In one embodiment, the first organic encapsulation layer 42 is formed on the first inorganic encapsulation layer 41 by any one of inkjet printing, spraying, or coating. When the first organic encapsulation layer 42 is prepared, the first organic encapsulation layer 42 does not overflow into the buffer area HC and the hole-digging area WK due to the blocking of the retaining wall 50, and the first organic encapsulation layer 42 is only correspondingly disposed on the light-emitting functional layer 30.

In one embodiment, any one of the physical organic vapor deposition (PVD), chemical vapor deposition (CVD), or atomic layer deposition (ALD) is employed again to deposit the second inorganic encapsulation layer 43 on the first organic encapsulation layer 42 and the retaining wall 50.

In one embodiment, after the preparation of the encapsulation layer 40 is completed, the layer in a direction from the retaining wall 50 to the hole-digging area WK is removed by laser or by exposure and etching to form a via hole. Before the functional layer 30 is formed, the planarization layer 27 and the pixel defining layer 29 of the retaining wall 50 close to the inner side of the hole-digging area WK have been removed, and then the encapsulating layer 40 is prepared. Accordingly, after the via hole is formed in the hole-digging area WK, the external water oxygen does not invade the light-emitting device via the planarization layer 27 and the pixel defining layer 29.

In this embodiment, by disposing the retaining wall on the pixel defining layer in the buffer area, the first organic encapsulating layer is blocked from overflowing during its preparation; and the top surface of the retaining wall is formed with a plurality of grooves, and thus the contact area between the retaining wall and the first inorganic encapsulating layer is increased, thereby effectively avoiding the problem that the layers are easily peeled off between the retaining wall and the first inorganic encapsulating layer. Meanwhile, after the preparation of the retaining wall is completed and before the encapsulation layer is prepared, the planarization layer and the pixel defining layer of the retaining wall close to the inner side of the hole-digging area are removed, such that the problem that the external water oxygen invades the light-emitting device via the planarization layer 27 and the pixel defining layer 29 is solved.

Figure 3:
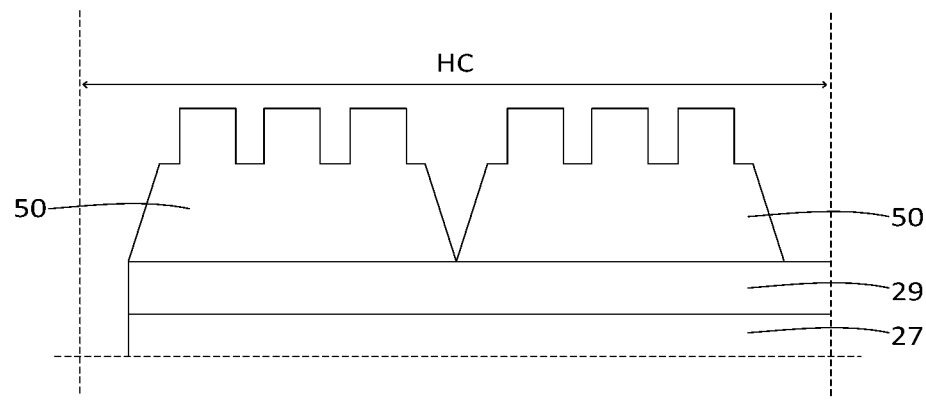
FIG. 3 is a first schematic cross-sectional view showing a plurality of rows of retaining walls according to an embodiment of the present application.

In an embodiment, as shown in FIG. 3, differences from the above embodiment is that two retaining walls 50 are formed on the pixel defining layer 29 of the buffer area HC, and the top surface of the retaining wall 50 is provided with a protrusion.

In one embodiment, the cross-sectional shape of the two retaining walls 50 may be one of a trapezoidal shape, a square shape, and the like, and preferably a trapezoidal cross-sectional shape in this embodiment, as shown in FIG. 3.

In one embodiment, the two retaining walls 50 are made of organic materials.

In an embodiment, the number of the retaining walls may also be greater than two.

In one embodiment, the number of the protrusions on the top surface of the retaining wall 50 may be one or more, and preferably three in this embodiment, as shown in FIG. 3.

In one embodiment, the cross-sectional shape of the protrusion is a polygon such as a trapezoid, a square, an arc, or a triangle, and preferably a square in embodiment.

In one embodiment, the retaining wall 50 is formed on the pixel defining layer 29 of the buffer area HC by exposure and etching. Then, the pixel defining layer 29 and the planarization layer 27 of the retaining wall close to the inner side of the hole-digging area are removed by laser, exposure and etching, or the like, such that external water oxygen is prevented from invading the light-emitting device through the pixel defining layer and the planarization layer.

In one embodiment, the protrusions are prepared on the top surface of the retaining wall by nanoimprinting or laser etching.

Compared with the previous embodiment in which one retaining wall is provided, in this embodiment, by preparing two retaining walls on the pixel defining layer in the buffer area and providing protrusions on the two retaining walls, and the contact area between the retaining wall and the encapsulating layer is larger, and the problem of film peeling between the retaining wall and the encapsulating layer is better avoided.

Figure 4:
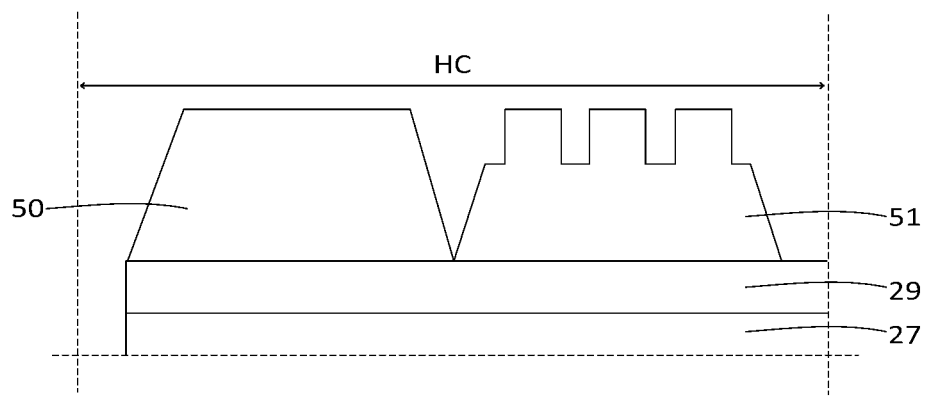
FIG. 4 is a second schematic cross-sectional view showing a plurality of rows of retaining walls according to an embodiment of the present application.

In an embodiment, as shown in FIG. 4, differences from the embodiment shown in FIG. 3 is that two retaining walls 50 are formed on the pixel defining layer in the buffer area, wherein one of the retaining walls is provided with the protrusions, and the other one of retaining walls is provided with no protrusion. A number of the protrusions is preferably three. Details of the protrusions can be referred to the above embodiment, and not repeated herein for brevity.

In one embodiment, the display panel includes display area, a hole-digging area, and a buffer area between the display area and the hole-digging area.

In an embodiment, the hole-digging area may be located at any position in the display area, and the buffer area is disposed around the hole-digging area.

Figure 5:
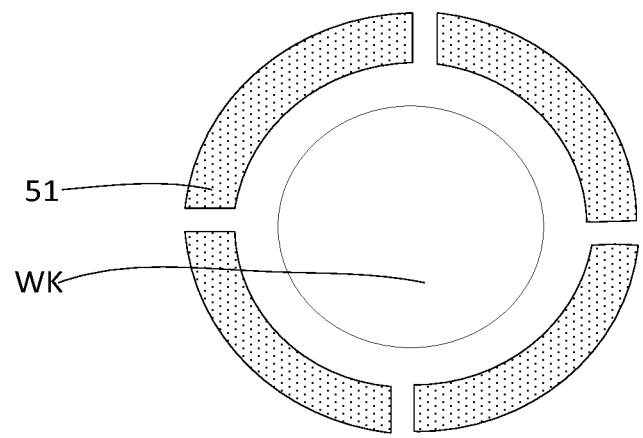
FIG. 5 to FIG. 8 are schematic diagrams showing a surface structure of a groove of a top surface of a retaining wall according to an embodiment of the present application.

In one embodiment, as shown in FIG. 5, the opening formed in the hole-digging area WK may have a shape of a circle, an ellipse, or a polygon, etc. In this embodiment, the opening formed in the hole-digging area preferably has a circular shape.

In one embodiment, one or more rows of retaining walls are disposed in the buffer area, and a top surface of at least one of the retaining walls is provided with a groove or a protrusion.

In one embodiment, a plurality of retaining walls are disposed in the buffer area, and the top surface of the retaining wall is provided with grooves or protrusions.

In one embodiment, the grooves or protrusions are arranged in a row.

In one embodiment, as shown in FIG. 5, the grooves or protrusions 51 are not disposed continuously.

Figure 6:
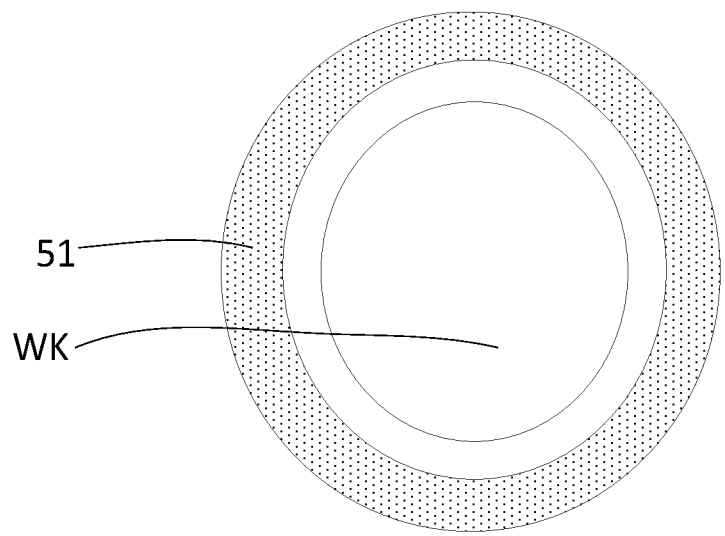

In one embodiment, as shown in FIG. 6, the grooves or protrusions 51 are continuously disposed.

In one embodiment, the grooves or protrusions are arranged in a plurality of rows.

In one embodiment, the grooves or protrusions are discontinuously disposed.

Figure 7:
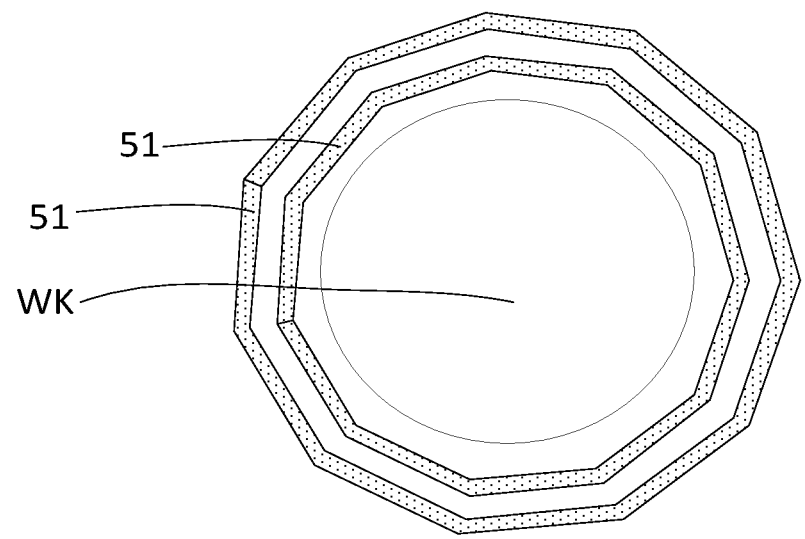

In one embodiment, the grooves or protrusions are arranged continuously as shown in FIG. 7.

Figure 8:
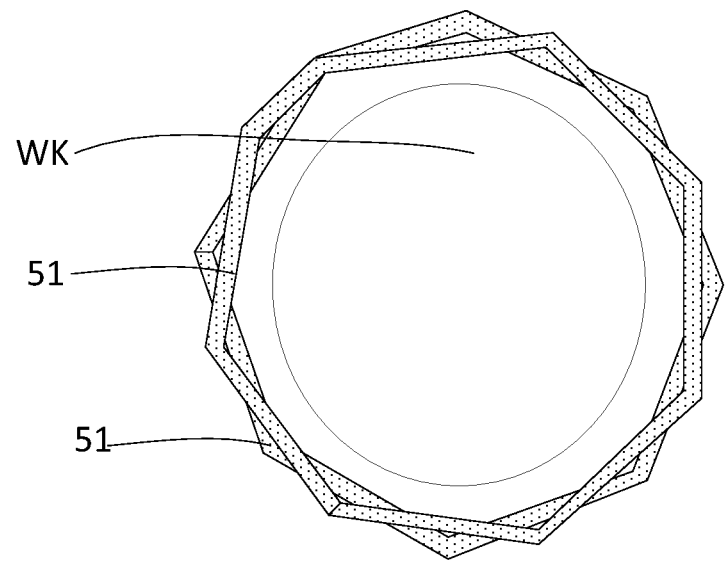

In one embodiment, the grooves or protrusions are arranged in a plurality of rows, and the plurality of rows of grooves or protrusions have an intersection, as shown in FIG. 8.

In one embodiment, surface shapes of each of the grooves or protrusions may be a circular ring, an irregular arc, a broken line, or the like.

In an embodiment, when the retaining walls are arranged in a plurality of rows, the topography of the top surface of the retaining wall is not repeated for brevity.

In this embodiment, by providing one or more rows of grooves or protrusions on the top surface of the retaining wall, and setting the surface shape of each of the grooves or the protrusions into various rings, irregular arcs or broken lines, etc., the contact area between the retaining wall and the encapsulating layer is increased, thus avoiding the problem of film peeling between the retaining wall and the encapsulating layer.

Figure 9:
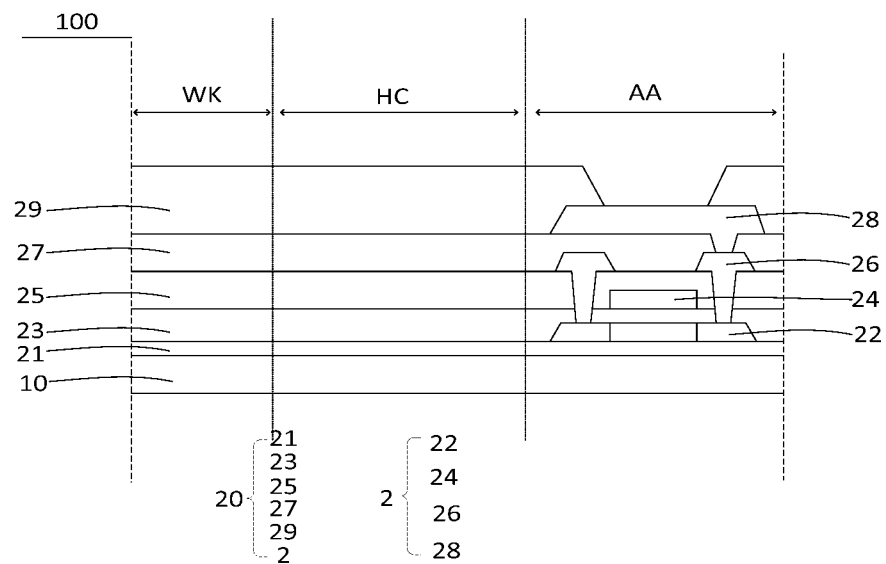
FIG. 9 to FIG. 15 are schematic diagrams showing a structure of layers in each of the steps of a method of fabricating a display panel respectively according to an embodiment of the present application.

In one embodiment, a method of fabricating a display panel is provided, the method including the steps of:

S1, providing a substrate 10, in which a driving circuit layer 20 is prepared on the substrate 10, the driving circuit layer 20 including a buffer layer 21, an active layer 22, a gate insulating layer 23, a gate layer 24, and an interlayer dielectric layer 25, a source drain layer 26, a planarization layer 27, a pixel electrode layer 28, and a pixel defining layer 29, which are stacked, wherein the active layer 22, the gate layer 24, the source drain layer 26, and the pixel electrode layer 28 constitute a driving circuit 2, the buffer layer 21, the gate insulating layer 23, the interlayer insulating layer 25, the planarization layer 27, and the pixel defining layer 29 of the driving circuit layer 20 extend from the display area AA to the buffer layer HC and the hole-digging area WK, while the driving circuit 2 does not extend to the buffer layer HC and the hole-digging area WK, as shown in FIG. 9.

Figure 10:
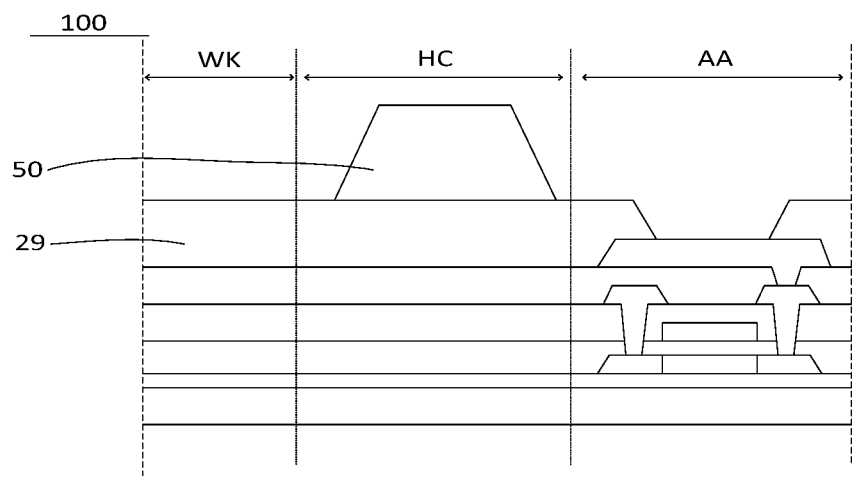

S2, forming a retaining wall, in which exposure and etching processes are used to prepare a retaining wall 5 on the pixel defining layer 29 of the buffer area HC, wherein the retaining wall 50 has a trapezoidal cross-sectional shape, and the retaining wall is made of an organic material, as shown in FIG. 10.

Figure 11:
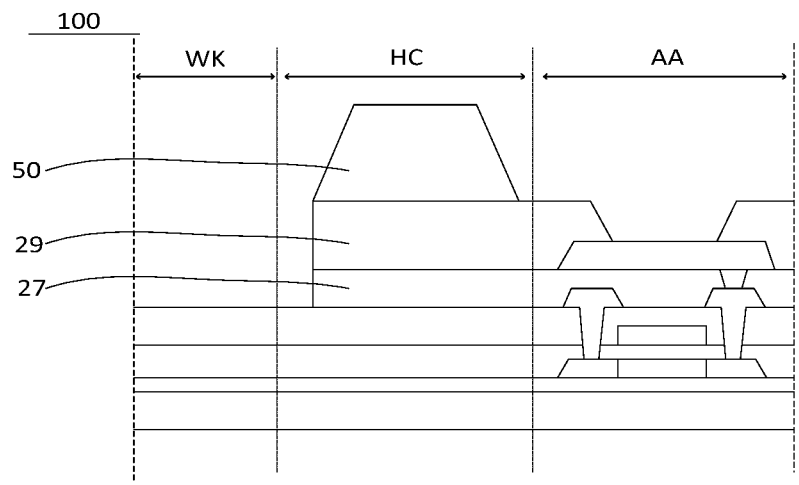

S3, removing the pixel defining layer and the planarization layer, in which the pixel defining layer 29 and the planarization layer 27 of the retaining wall 50 close to the inner side of the hole-digging area WK are removed by laser, exposure and etching, or the like, as shown in FIG. 11.

Figure 12:
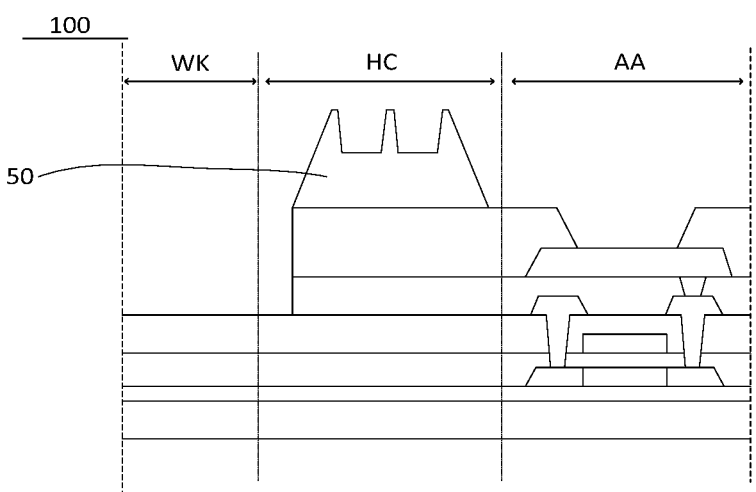

S4, forming grooves, in which grooves are formed on a top surface of the retaining wall 50 by nanoimprinting or laser etching, wherein the cross-sectional shape of the groove is an inverted trapezoid, and a number of the grooves is two, as shown in FIG. 12.

Figure 13:
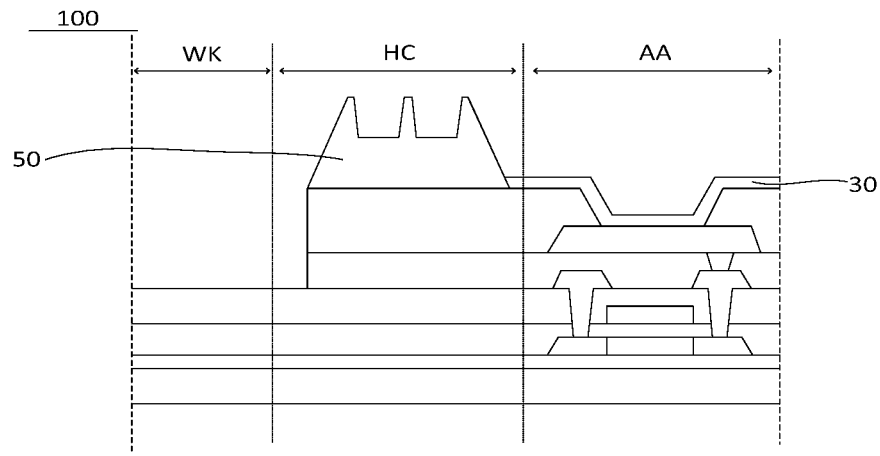

S5, forming a light-emitting functional layer, in which the light-emitting functional layer 30 is formed on the pixel defining layer, as shown in FIG. 13.

Figure 14:
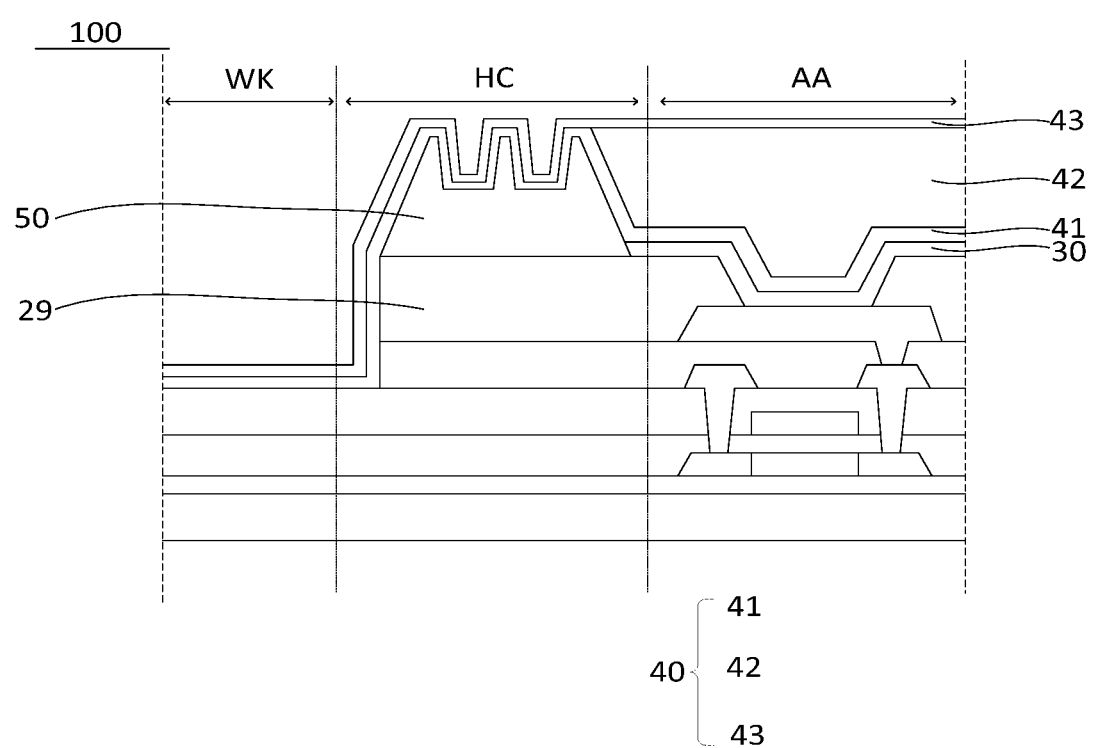

S6, forming an encapsulation layer, in which any one of physical vapor deposition (PVD), chemical vapor deposition (CVD), or atomic layer deposition (ALD) is employed to deposit the first inorganic encapsulation layer 41 on the light-emitting functional layer 30 and the retaining wall, and the first inorganic encapsulation layer 41 is filled in the groove of the top surface of the retaining wall 50, and any one of inkjet printing, spraying, or coating is employed to form the first organic encapsulation layer 42 on the first inorganic encapsulation layer 41, such that the first organic encapsulation layer 42 does not overflow into the buffer area HC and the hole-digging area WK due to the blocking of the retaining wall 50, and the first organic encapsulation layer 42 is only correspondingly disposed on the light-emitting functional layer 30. Physical vapor deposition (PVD), chemical vapor deposition (CVD), or atomic layer deposition (ALD) is employed again to deposit the second inorganic encapsulation layer 43 on the first organic encapsulation layer 42 and the retaining wall 50, as shown in FIG. 14.

Figure 15:
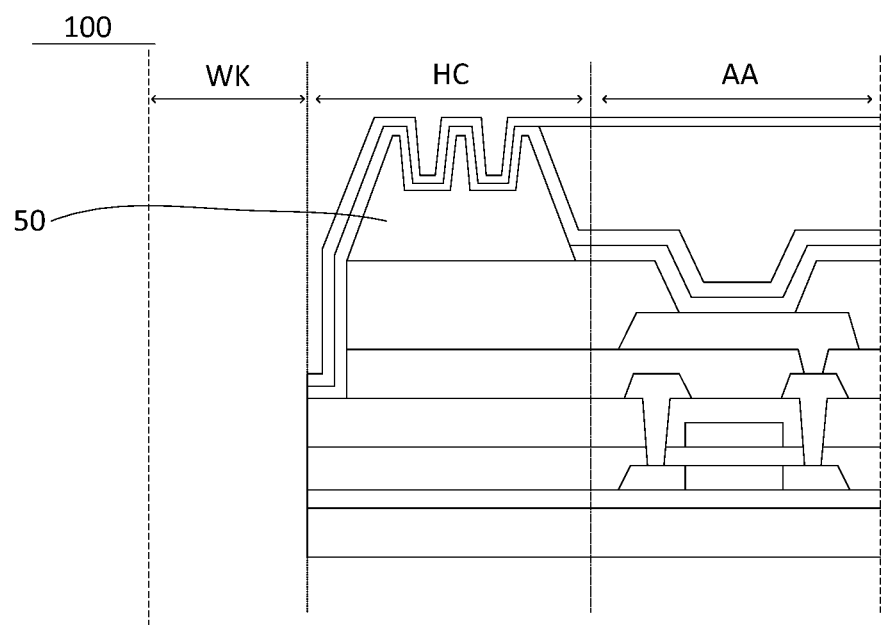

S7, opening the hole-digging area, in which the layer in a direction from the retaining wall 50 to the hole-digging area WK is removed by laser or by exposure and etching to form a via hole, as shown in FIG. 15.

In one embodiment, in the method of fabricating a display panel provided by this embodiment, a retaining wall preferably having a trapezoidal cross-sectional shape is formed in a buffer area, and two grooves having an inverted trapezoidal cross-sectional shape are formed on a top surface of the retaining wall, but not particularly limited thereto.

In an embodiment, a display device is further provided, the display device includes a display panel, wherein the display panel includes a display area, a hole-digging area, and a buffer area between the display area and the hole-digging area. The display panel further includes: a substrate; a driving circuit layer disposed on the substrate, and not disposed in the buffer area and the hole-digging area; a pixel defining layer disposed on the driving circuit layer; a light-emitting functional layer disposed on the pixel defining layer; a retaining wall disposed in the buffer area and on the pixel defining layer; and an encapsulation layer disposed on the light-emitting functional layer and the retaining wall, wherein a contact area between a top surface of the retaining wall and the encapsulation layer is larger than an orthographically projected area of the top surface of the retaining wall on the substrate.

In one embodiment, the top surface of the retaining wall is formed with at least one of grooves and protrusions.

In one embodiment, the grooves or protrusions are continuously disposed.

In one embodiment, the grooves or protrusions are disposed discontinuously.

In one embodiment, the grooves or the protrusions formed on the top surface of the retaining wall are arranged in a row.

In one embodiment, the grooves or the protrusions formed on the top surface of the retaining wall are arranged in a plurality of rows.

In one embodiment, the plurality of rows of the grooves or the protrusions formed on the top surface of the retaining wall have an intersection.

In one embodiment, the grooves or the protrusions have sectional shapes including at least one of an inverted trapezoid, a square, and an arc.

In one embodiment, a plurality of rows of the retaining walls are formed in the buffer area, and at least one of the plurality of rows of the retaining walls is formed with grooves at their top surfaces.

In one embodiment, plurality of rows of the retaining walls are formed in the buffer area, and at least one of the plurality of rows of the retaining walls is formed with protrusions at their top surfaces.

This embodiment provides a display panel, the display panel includes a display area, a hole-digging area, and a buffer area between the display area and the hole-digging area, wherein one or more retaining walls on the pixel defining layer in the buffer area, a top surface of the retaining wall is provided with at least one groove or protrusion; the encapsulating layer is disposed on the light-emitting functional layer and the retaining wall, a contact area between a top surface of the retaining wall and the encapsulation layer is larger than an orthographically projected area of the top surface of the retaining wall on the substrate. The present application avoids the problem of film peeling between the retaining wall and the encapsulating layer by increasing the contact area between the top surface of the retaining wall and the encapsulating layer.

According to the above embodiments, the present application provides a display panel, a method for fabricating the same, and a display device, and the display panel includes a display area, a hole-digging area, and a buffer area between the display area and the hole-digging area, wherein one or more retaining walls on the pixel defining layer in the buffer area, a top surface of the retaining wall is provided with at least one groove or protrusion; the encapsulating layer is disposed on the light-emitting functional layer and the retaining wall, a contact area between a top surface of the retaining wall and the encapsulation layer is larger than an orthographically projected area of the top surface of the retaining wall on the substrate. The present application provides a groove or a protrusion on the top surface of the retaining wall in the buffer area, such that the contact area between the top surface of the retaining wall and the encapsulating layer is increased, thus avoiding the problem of film peeling between the retaining wall and the encapsulating layer.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display panel, comprising a display area, a hole-digging area, and a buffer area between the display area and the hole-digging area; the display panel comprising:
    a substrate;
    a driving circuit layer disposed on the substrate, and not disposed in the buffer area and the hole-digging area;
    a pixel defining layer disposed on the driving circuit layer;
    a light-emitting functional layer disposed on the pixel defining layer;
    a retaining wall disposed in the buffer area and on the pixel defining layer; and
    an encapsulation layer disposed on the light-emitting functional layer and the retaining wall, wherein
    a contact area between a top surface of the retaining wall and the encapsulation layer is larger than an orthographically projected area of the top surface of the retaining wall on the substrate; and
    the top surface of the retaining wall is formed with at least one of grooves recessing downward perpendicular to the substrate or protrusions protruding upward perpendicular to the substrate;
    the grooves or the protrusions formed on the top surface of the retaining wall are arranged in a plurality of rows; and
    the plurality of rows of the grooves or the protrusions formed on the top surface of the retaining wall have an intersection in a top view of the retaining wall.

2. The display panel according to claim 1, wherein the grooves or protrusions are continuously disposed.

3. The display panel according to claim 1, wherein the grooves or the protrusions have sectional shapes comprising at least one of an inverted trapezoid, a square, and an arc.

4. The display panel according to claim 1, wherein a plurality of rows of the retaining walls are formed in the buffer area, and at least one of the plurality of rows of the retaining walls is formed with grooves at their top surfaces.

5. The display panel according to claim 1, wherein a plurality of rows of the retaining walls are formed in the buffer area, and at least one of the plurality of rows of the retaining walls is formed with protrusions at their top surfaces.

6. A display device comprising a display panel, the display panel comprising a display area, a hole-digging area, and a buffer area between the display area and the hole-digging area; the display panel comprising:
    a substrate;
    a driving circuit layer disposed on the substrate, and not disposed in the buffer area and the hole-digging area;
    a pixel defining layer disposed on the driving circuit layer;
    a light-emitting functional layer disposed on the pixel defining layer;
    a retaining wall disposed in the buffer area and on the pixel defining layer; and
    an encapsulation layer disposed on the light-emitting functional layer and the retaining wall, wherein
    a contact area between a top surface of the retaining wall and the encapsulation layer is larger than an orthographically projected area of the top surface of the retaining wall on the substrate; and
    the top surface of the retaining wall is formed with at least one of grooves recessing downward perpendicular to the substrate or protrusions protruding upward perpendicular to the substrate;
    the grooves or the protrusions formed on the top surface of the retaining wall are arranged in a plurality of rows; and the plurality of rows of the grooves or the protrusions formed on the top surface of the retaining wall have an intersection in a top view of the retaining wall.

7. The display device according to claim 6, wherein the grooves or protrusions are continuously disposed.

8. The display device according to claim 6, wherein the grooves or the protrusions have sectional shapes comprising at least one of an inverted trapezoid, a square, and an arc.

9. The display device according to claim 6, wherein a plurality of rows of the retaining walls are formed in the buffer area, and at least one of the plurality of rows of the retaining walls is formed with grooves at their top surfaces.

10. The display device according to claim 6, wherein a plurality of rows of the retaining walls are formed in the buffer area, and at least one of the plurality of rows of the retaining walls is formed with protrusions at their top surfaces.

\* \* \* \* \*